United States Patent
Sun et al.

(10) Patent No.: US 10,772,367 B2
(45) Date of Patent: Sep. 15, 2020

(54) WIRE-FREE LED LUMINOUS GLOVE

(71) Applicant: Shenzhen Xinhualong Electronic Co., Ltd., Shenzhen, Guangdong Province (CN)

(72) Inventors: Liwei Sun, Shenzhen (CN); Haibo Yu, Shenzhen (CN)

(73) Assignee: SHENZHEN XINHUALONG ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 16/367,690

(22) Filed: Mar. 28, 2019

(65) Prior Publication Data

US 2019/0297969 A1    Oct. 3, 2019

(30) Foreign Application Priority Data

Mar. 30, 2018 (CN) ..................... 2018 2 0467516 U

(51) Int. Cl.
| | |
|---|---|
| *A41D 19/015* | (2006.01) |
| *F21V 33/00* | (2006.01) |
| *F21V 19/00* | (2006.01) |
| *H05K 1/14* | (2006.01) |
| *H05K 3/36* | (2006.01) |
| *H05K 1/18* | (2006.01) |
| *F21V 8/00* | (2006.01) |
| *H05K 3/30* | (2006.01) |
| *F21Y 115/10* | (2016.01) |
| *F21Y 105/12* | (2016.01) |

(52) U.S. Cl.
CPC ...... *A41D 19/0157* (2013.01); *F21V 19/0015* (2013.01); *F21V 33/0008* (2013.01); *G02B 6/001* (2013.01); *H05K 1/14* (2013.01); *H05K 1/181* (2013.01); *H05K 3/303* (2013.01); *H05K 3/361* (2013.01); *F21Y 2105/12* (2016.08); *F21Y 2115/10* (2016.08); *H05K 2201/10106* (2013.01)

(58) Field of Classification Search
CPC ..... A45C 15/06; A43B 3/001; F21V 33/0004; F21V 2200/10–17; F21V 33/0008; A41D 19/0157
See application file for complete search history.

(56) References Cited

U.S. PATENT DOCUMENTS

| | | | | |
|---|---|---|---|---|
| 4,691,987 A | * | 9/1987 | Ebner | ................. G02B 6/4249 385/134 |
| 5,086,378 A | * | 2/1992 | Prince | .................... F21V 21/08 362/103 |
| 6,848,819 B1 | * | 2/2005 | Arndt | ..................... F21S 45/47 362/545 |

(Continued)

*Primary Examiner* — Isiaka O Akanbi
*Assistant Examiner* — Steven Y Horikoshi
(74) *Attorney, Agent, or Firm* — McCormick, Paulding & Huber PLLC

(57) ABSTRACT

Disclosed is a wire-free LED luminous glove, including: a glove body within which LED luminous lamp beads are arranged, and an electronic board structure within the glove body which is provided with a control chip and a power supply, wherein the LED luminous lamp beads are welded to the electronic board structure, the electronic board structure is arranged at a wrist of the glove body, and the LED luminous lamp beads are configured such that luminous points of LED luminous lamp beads form a fan shape.

6 Claims, 4 Drawing Sheets

(56) References Cited

U.S. PATENT DOCUMENTS

| | | | | |
|---|---|---|---|---|
| 2008/0036362 A1* | 2/2008 | Tanimoto | ............... | H01L 24/97 |
| | | | | 313/498 |
| 2009/0003014 A1* | 1/2009 | Jablonski | ............ | A43B 1/0036 |
| | | | | 362/602 |
| 2011/0078842 A1* | 4/2011 | Tang | ................. | A41D 19/0157 |
| | | | | 2/160 |
| 2013/0181246 A1* | 7/2013 | Wu | ..................... | G02B 6/0085 |
| | | | | 257/98 |
| 2013/0200819 A1* | 8/2013 | Valenti | .................. | H05B 45/20 |
| | | | | 315/293 |

* cited by examiner

WIRE-FREE LED LUMINOUS GLOVE

CROSS-REFERENCE TO RELATED APPLICATION

This application claims foreign priority benefits under U.S.C. § 119 to Chinese Patent Application No. 201820467516.0 filed on Mar. 30, 2018, the content of which is hereby incorporated by reference in its entirety.

TECHNICAL FIELD

The disclosure relates to the technical field of luminous gloves, and more particularly, to a wire-free LED luminous glove.

BACKGROUND

A luminous glove effectively combines LED lamp beads with the glove. In the prior art, the LED lamp beads in the luminous glove are connected to a control circuit through 10 to 30 wires with a diameter of 0.6 to 1 mm and a length of 60 to 200 mm. Although the luminous glove can meet the use requirements of general situations, the electronic wires are easily broken during its actual wearing and usage due to cross overlapping welding and fixation in a limited space. Meanwhile, the LED lamp beads connected by the electronic wires are pin-type LED lamp beads, and a pin thereof is easy to penetrate the glove when in use, so that potential safety hazards exist. Moreover, the glove has concentrated luminous points and a small luminous area, affecting the comfort of the glove in use, and therefore, limiting the applicability and practicability.

SUMMARY

The disclosure is intended to provide a wire-free LED luminous glove with reasonable structure and use stability and reliability.

According to the disclosure, there is provided a wire-free LED luminous glove, comprising: a glove body within which LED luminous lamp beads are arranged, and an electronic board structure within the glove body which is provided with a control chip and a power supply, wherein the LED luminous lamp beads are welded to the electronic board structure, the electronic board structure is arranged at a wrist of the glove body, and the LED luminous lamp beads are configured such that luminous points of LED luminous lamp beads form a fan shape.

In some embodiments, the electronic board structure comprises a hard electronic board on which the LED luminous lamp beads are welded.

In some embodiments, the electronic board structure comprises a hard electronic board and a flexible printed circuit board welded on the hard electronic board, and the LED luminous lamp beads are welded on the flexible printed circuit board.

In some embodiments, the flexible printed circuit board is located at a back of the glove body.

In some embodiments, the flexible printed circuit board is welded on the hard electronic board, the flexible printed circuit board extends to each finger of the glove body, and each of the LED luminous lamp beads is welded on a respective portion of flexible printed circuit board at a respective finger.

In some embodiments, the LED luminous lamp beads are SMD LED lamp beads.

In some embodiments, each finger of the glove body is internally provided with a thermoplastic polyurethane elastomer rubber light guide strip bonded to the LED luminous lamp bead through hot melt adhesive.

In some embodiments, the LED luminous lamp beads are SMD LED lamp bead.

The disclosure has reasonable structure arrangement, which directly welds and fixes the LED luminous lamp beads on the electronic board structure, thus reducing the use of the wire, greatly reducing the cost of manufacture (through experimental statistics, the reduction of the use of the wire can lead to a reduction of the manufacture cost by about 40%), improving the matching comfort, preventing wire breakage caused by pulling and bending, and being beneficial to the improvement of the stability and reliability when in use. Meanwhile, the thermoplastic polyurethane elastomer rubber light guide strip allows for not only soft and resilient hand feeling, but also better light divergence and larger luminous area due to its uniform, soft and colorful light effect, which has strong applicability and good practicability.

BRIEF DESCRIPTION OF THE DRAWINGS

In order to make the contents of the disclosure be clearly understood, the disclosure is further described in detail with reference to the detailed embodiments and the drawings, wherein.

DETAILED DESCRIPTION

First Embodiment

Figure 1:
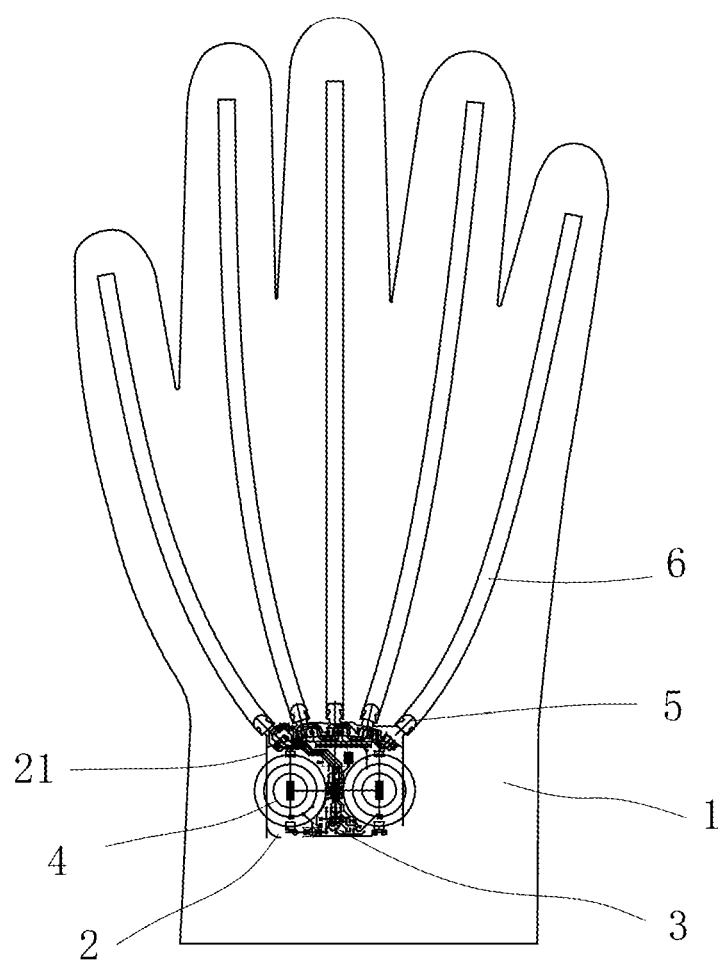
FIG. 1 is a diagram illustrating a first structure of the disclosure.
Figure 2:
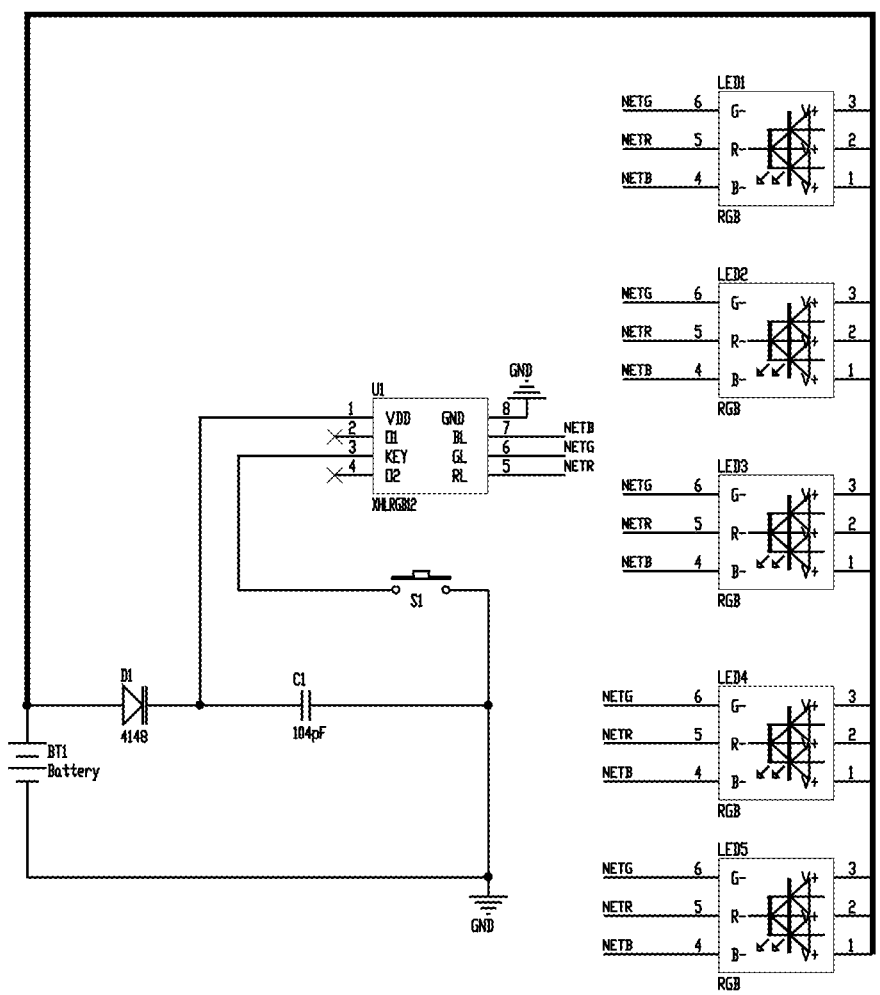
FIG. 2 is a circuit diagram of the disclosure.

FIG. 1 and FIG. 2 show a detailed embodiment of the disclosure, wherein FIG. 1 is a structure diagram of the disclosure; and FIG. 2 is a circuit diagram of the disclosure.

With reference to FIG. 1 and FIG. 2, a wire-free LED luminous glove comprises a glove body 1 and an electronic board structure 2 in the glove body 1, the electronic board structure 2 is provided with a control chip 3 and a power supply 4. In the embodiment, the power supply can be directly installed on a control electronic board structure or fixed by a box, the glove body 1 is internally provided with LED luminous lamp beads 5, the LED luminous lamp beads 5 welded onto the electronic board structure 2. The electronic board structure 2 is arranged at a wrist of the glove body, each finger of the glove body 1 is internally provided with a thermoplastic polyurethane elastomer rubber light guide strip 6 bonded to the LED luminous lamp bead through hot melt adhesive. In the embodiment, the electronic board structure 2 is a hard electronic board 21, and the LED luminous lamp beads are welded on the hard electronic board. Moreover, the electronic board structure is arranged at the wrist, and luminous points of the LED luminous lamp beads are distributed in a fan shape, particularly, the LED luminous lamp bead on the outermost side forms an included angle of about 45 degrees with a horizontal line, a second LED luminous lamp bead forms an included angle of about 76 degrees with the horizontal line, a third LED luminous lamp bead forms an included angle of about 90 degrees with the horizontal line, a fourth LED luminous lamp bead forms an included angle of about 75 degrees with the horizontal line, and a fifth LED luminous lamp bead forms an included angle of about 55 degrees with the horizontal line.

The disclosure has reasonable structure arrangement, which directly welds and fixes the LED luminous lamp beads on the electronic board structure, thus reducing the use of the wire, greatly reducing the cost of manufacture (through experimental statistics, the reduction of the use of the wire can lead to a reduction of the manufacture cost by about 40%), improving the matching comfort, preventing wire breakage caused by pulling and bending, and being beneficial to the improvement of the stability and reliability when in use. Meanwhile, the thermoplastic polyurethane elastomer rubber light guide strip allows for not only soft and resilient hand feeling, but also better light divergence and larger luminous area due to its uniform, soft and colorful light effect, which has strong applicability and good practicability.

Second Embodiment

Figure 3:
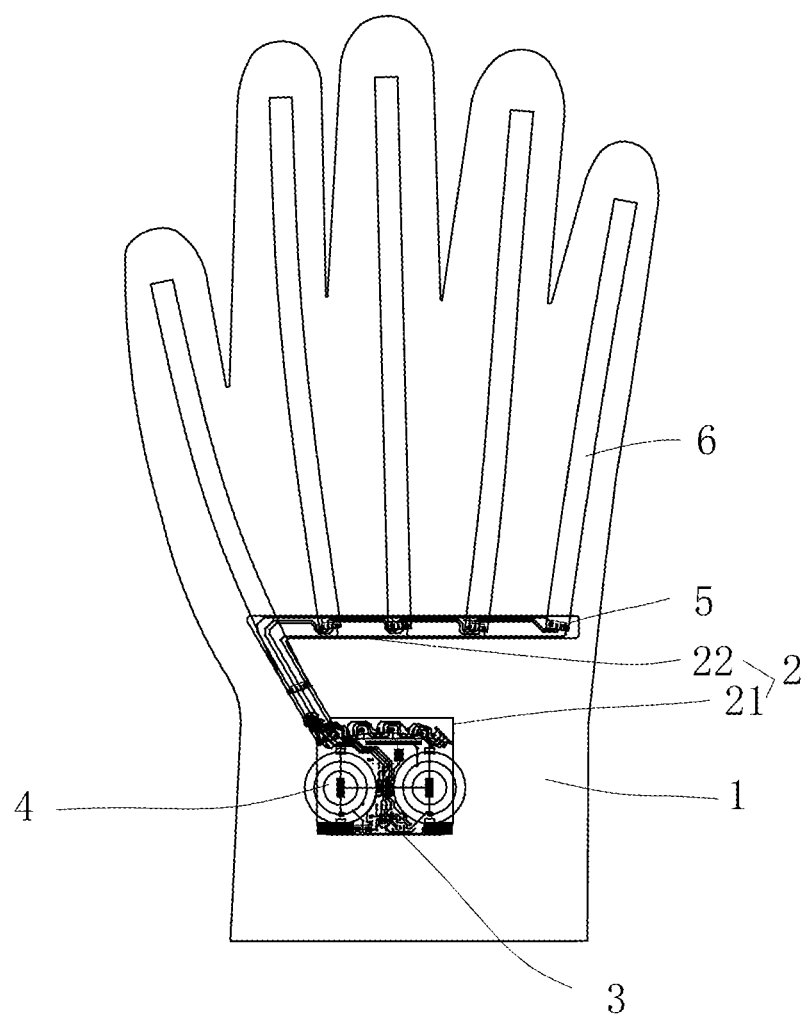
FIG. 3 is a diagram illustrating a second structure of the disclosure.

FIG. 3 shows another embodiment of the disclosure, and FIG. 3 is a diagram illustrating a second structure of the disclosure.

In the embodiment, an electronic board structure 2 comprises a hard electronic board 21 and a flexible printed circuit board 22, LED luminous lamp beads are welded on the flexible printed circuit board, but the circuit board provided with the lamp beads and the electronic board structure are integrated. Moreover, each finger of the glove body is internally provided with a thermoplastic polyurethane elastomer rubber light guide strip bonded to the LED luminous lamp bead through hot melt adhesive.

Third Embodiment

Figure 4:
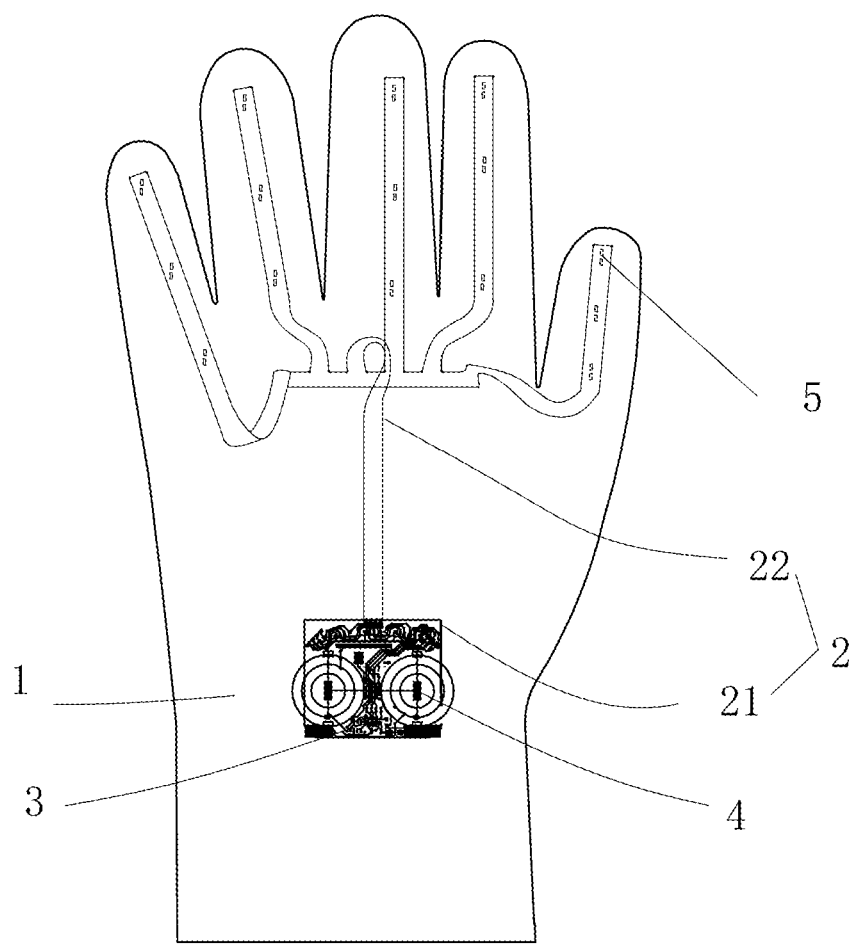
FIG. 4 is a diagram illustrating a third structure of the disclosure.

FIG. 4 shows another detailed embodiment of the disclosure, and FIG. 4 is a diagram illustrating a third structure of the disclosure.

In the embodiment, an electronic board structure 2 comprises a hard electronic board 21 and a flexible printed circuit board 22 extending into fingers, and meanwhile, an LED luminous lamp bead is directly fixed on the flexible printed circuit board in each finger.

It is apparent that the embodiments of the disclosure above are only examples for clearly explaining the disclosure, and are not intended to limit the embodiments of the disclosure. For those of ordinary skills in the art, other different forms of changes or variations can be made on the basis of the description above. All the embodiments need not and cannot be exhaustive here. These obvious changes or variations, which belong to the essential principle of the disclosure, shall still fall within the protection scope of the disclosure.

What is claimed is:

1. A LED luminous glove, comprising:
a glove body within which LED luminous lamp beads are arranged, and
an electronic board structure within the glove body which is provided with a control chip and a power supply,
wherein the LED luminous lamp beads are welded to the electronic board structure, the electronic board structure is arranged at a wrist of the glove body, and the LED luminous lamp beads are configured such that luminous points of LED luminous lamp beads form a fan shape, and
wherein the electronic board structure comprises a hard electronic board and a flexible printed circuit board welded on the hard electronic board, and the LED luminous lamp beads are welded on the flexible printed circuit board.

2. The LED luminous glove according to claim 1, wherein the flexible printed circuit board is located at a back of the glove body.

3. The LED luminous glove according to claim 1, wherein the flexible printed circuit board is welded on the hard electronic board, the flexible printed circuit board extends to each finger of the glove body, and each of the LED luminous lamp beads is welded on a respective portion of flexible printed circuit board at a respective finger.

4. The LED luminous glove according to claim 1, wherein the LED luminous lamp beads are SMD LED lamp beads.

5. The LED luminous glove according to claim 1, wherein each finger of the glove body is internally provided with a thermoplastic polyurethane elastomer rubber light guide strip bonded to the LED luminous lamp bead through hot melt adhesive.

6. The LED luminous glove according to claim 1, wherein the LED luminous lamp beads are SMD LED lamp beads.

* * * * *